US010123449B1

(12) United States Patent
Stevens et al.

(10) Patent No.: US 10,123,449 B1
(45) Date of Patent: Nov. 6, 2018

(54) CABLE BRACKETS FOR DATACENTER RACKS

(71) Applicant: Hewlett Packard Enterprise Development LP, Houston, TX (US)

(72) Inventors: Matthew E. Stevens, Houston, TX (US); Derrick G. Runcie, Houston, TX (US); Keli Barham, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/621,374

(22) Filed: Jun. 13, 2017

(51) Int. Cl.
*H05K 7/14* (2006.01)
*H05K 5/02* (2006.01)

(52) U.S. Cl.
CPC ......... *H05K 7/1491* (2013.01); *H05K 5/0217* (2013.01); *H05K 5/0247* (2013.01)

(58) Field of Classification Search
CPC .. H05K 7/1491; H05K 5/0217; H05K 5/0242; H05K 5/0247
USPC ............................ 174/60, 24, 64, 135; 211/26
See application file for complete search history.

(56) References Cited

U.S. PATENT DOCUMENTS

| 6,005,188 A * | 12/1999 | Teichler ............... H02B 1/50 174/50 |
| 6,600,665 B2 | 7/2003 | Lauchner |
| 7,189,924 B1 | 3/2007 | Popescu et al. |
| 7,534,958 B2 * | 5/2009 | McNutt ................ G02B 6/3897 174/101 |
| 7,594,628 B2 | 9/2009 | Yang et al. |
| 8,215,498 B2 | 7/2012 | Rathbone et al. |
| 2013/0301225 A1 | 11/2013 | Gong et al. |
| 2014/0097000 A1 | 4/2014 | Lin et al. |
| 2014/0153187 A1 | 6/2014 | Liu et al. |

OTHER PUBLICATIONS

Middle Atlantic PCD Series Plastic Cable Ducts CableOrganizer. com; "Middle Atlantic PCD Series Plastic Cable Ducts"; printed Apr. 17, 2017 from: https://www.cableorganizer.com/middleatlantic/pcdplasticcableducts/; 7 pages.
Vertical Cable Management | Server Rack Cable Organization Tools; "Vertical Cable Management"; printed Apr. 17, 2017 from http://www.rackmountsolutions.net/verticalcablemanagement.asp; 2 pages.

* cited by examiner

*Primary Examiner* — Dhirubhai R Patel
(74) *Attorney, Agent, or Firm* — Hewlett Packard Enterprise Patent Department

(57) ABSTRACT

Examples herein relate to a cable bracket for a datacenter rack, the cable bracket includes a plurality of retention clamps, each retention clamp adapted to retain a cable and a side plate longitudinally connected to the plurality of retention clamps, the side plate includes mechanical attachment features. The side plate of the cable bracket is adapted to be directly attached by the mechanical attachment features on a rail of the datacenter rack and the cable bracket is located between the rail and a side panel of the datacenter rack.

10 Claims, 3 Drawing Sheets

CABLE BRACKETS FOR DATACENTER RACKS

BACKGROUND

A datacenter rack includes a rack and a plurality of server modules received in the rack. Many cables for transferring signals or providing power as e.g. power cords can be found in a rear end of the rack where the real rails of the rack are established.

BRIEF DESCRIPTION OF THE DRAWINGS

The space of the rear end of the rack in datacenter racks may be limited and the cables may not be arranged in an orderly manner so they may cause interference issues when installing side panels in the rack. Furthermore, an unordered distribution of the cord cables may cause the damage of the cord cables within the rack. Hence a simple and efficient mechanism to manage these cables is shown in the present disclosure.

The following detailed description references the drawings, wherein.

DETAILED DESCRIPTION

Figure 1B:
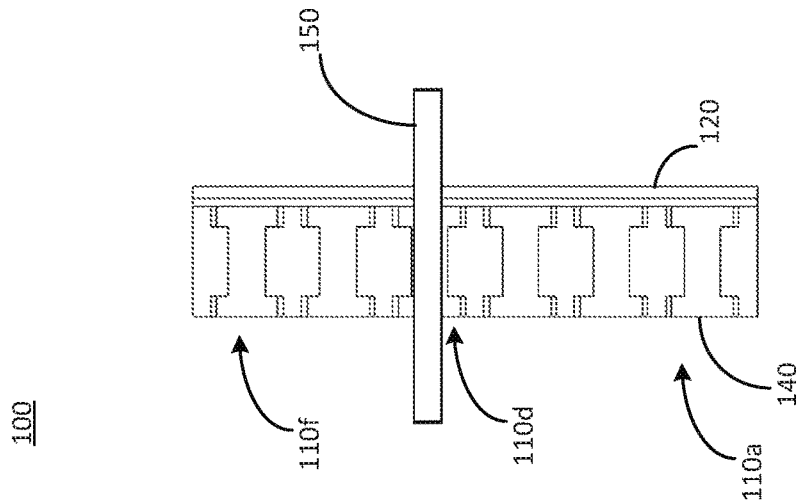
FIGS. 1A and 1B illustrate an example of a cable bracket according to the present disclosure.
Figure 1A:
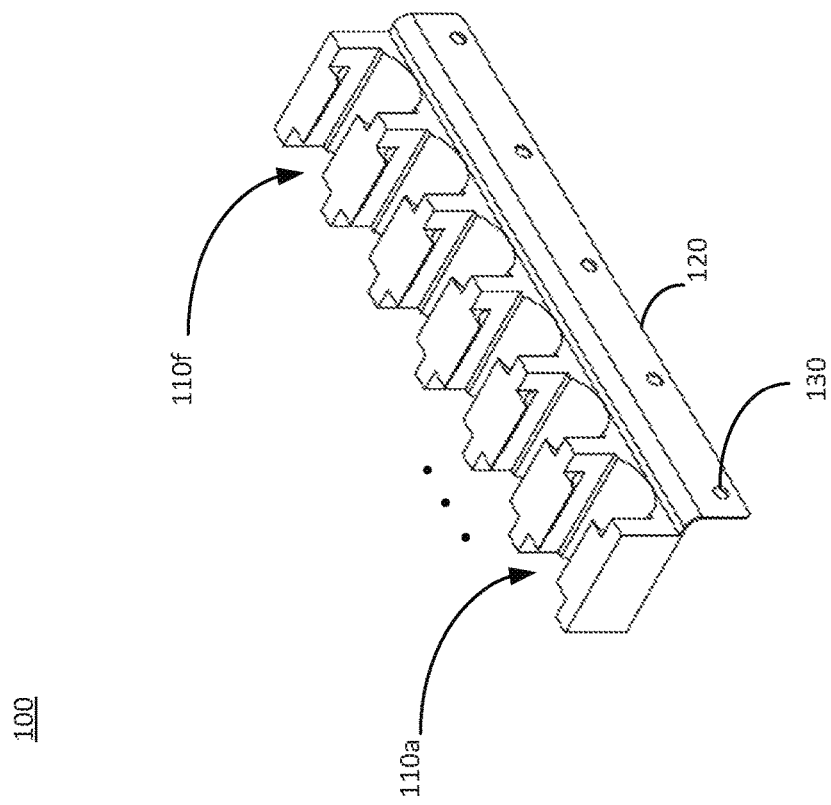

FIG. 1 shows an example of a cable bracket 100 for use in a datacenter rack according to the present disclosure. The cable bracket 100 comprises a plurality of retention clamps 110a to 110f. In this particular example, the cable bracket 100 comprises six retention clamps for retaining six cables. The cables can be any table of power cords or data cables for modules in a datacenter rack. Each retention clamp 110a to 110f can be adapted to retain a cable. The cable bracket 100 further comprises a side plate 120 longitudinally connected to the plurality of retention clamps 110a to 110f. The side plate 120 comprises mechanical attachment features 130. The side plate 120 of the cable bracket 100 can be directly attached by means of the mechanical attachment features 130 on a rail of the rack. Hence, the cable bracket 100 may be located between the rail and a side panel of the rack after installation of the side panel in the rack. The cable bracket can be made of metal, plastic or any other rigid material.

The mechanical attachment features 130 can be e.g. screw holes that permit the attachment of the side plate directly on the rail of the rack. Screws adapted to fit with the mechanical attachment features 130 can be used to fix the side panel 120 on the rail of the rack. In another implementation the mechanical attachment features 130 can be protrusions that cause the mechanical attachment of the side panel 120 on the rail of the rack. In this implementation, the rail of the datacenter rack may comprise holes to complementary fit with those protrusions.

In this example, the retention clamps 110a to 110f are established consecutively on the cable bracket 100. Each of the retention clamps 110a to 110f comprises a clamping slot 140 that defines an opening that can retain a cable as shown in FIG. 1B. This figure shows a top view of the cable bracket 100 comprising the side plate 120 and the retention clamps 110a to 110f having the clamping slot 140. This figure also shows a cable 150 being retained by the retention clamp 110d. The cable 150 can be e.g. a data cable and/or power jumper cable connected to e.g. a device installed in the rack or a switch installed on top of the datacenter rack.

Figure 2:
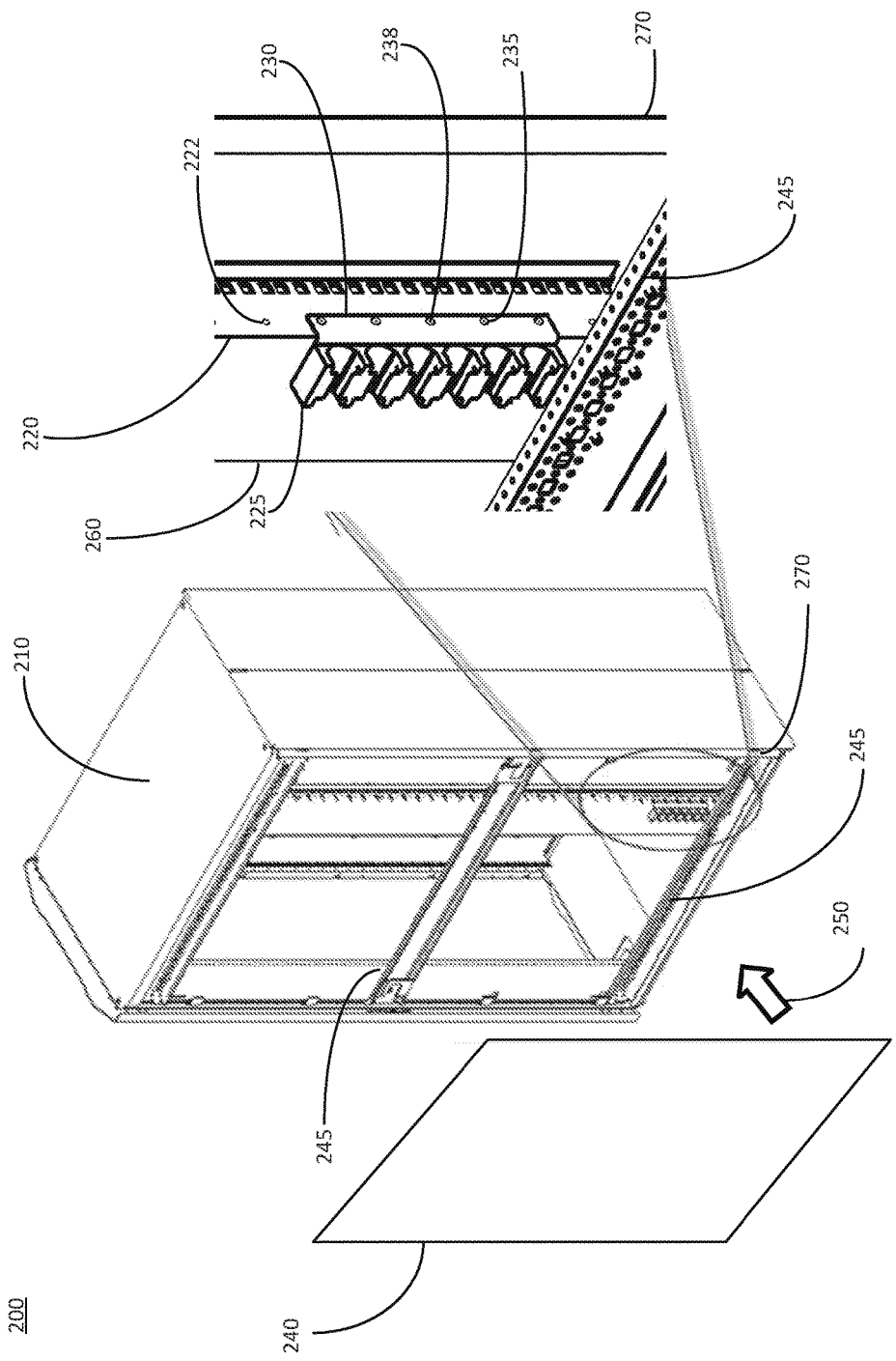
FIG. 2 illustrates an example of datacenter rack according to the present disclosure.

FIG. 2 shows an example of datacenter rack 200 according to the present disclosure. The datacenter rack 200 comprises a rack 210. The rack 210 comprises two side panels 240 (only one side panel is shown) adapted to be installed on the frames 245 on the sides of the rack 210 on the direction shown by arrow 250. FIG. 2 also shows a rear rail 220 established on the support frame 260 of the rack 210 and accessing doors 270. The rear rail 220 comprises mechanical attachment features 222. In this example, the mechanical attachment features 222 are screw holes. FIG. 2 shows an example of a cable bracket 225 comprising a side plate 230 which is directly attached by means of the mechanical attachment features 235 on the rear rail 220 of the rack 210. In this particular example, the mechanical attachment features 235 are screw holes. The side plate 230 can be attached to the rear rail 220 by means of the mechanical attachment features 235 of the side plate 230 and the mechanical attachment features 222 of the real rail 220 that can be fixated by means of screws 238. Hence, the cable bracket 225 does not require additional elements as e.g. a separate bracket to be attached on the real rail 220 in order to install the cable bracket 225 in the datacenter rack 200. Hence, the proposed cable bracket 225 can be installed by means of the side plate 230 directly on the rear rail 220 or on any other rail of the rack 210, e.g. a front rail not shown. In another implementations, other mechanical attachments features on the side plate 230 and on the real rail 220 could be used, as e.g. protrusions on the side plate 230 and holes coupling those protrusions on the real rail 220.

After the attachment of the side plate 230 on the real rail 220, the cable bracket 225 can be located between the real rail 220 and the side panel 240 without causing interference issues during and after the installation of the side panels 240. In this particular example, the cable bracket 225 comprises six retentions clamps to retain six cord cables independently. The cable bracket 225 can decrease the risk of damaging the cords cables during and after the installation of the side panels 240. Furthermore, the cable bracket 225 can avoid pushing the side panels 240 out of the rack after being installed.

Figure 3:
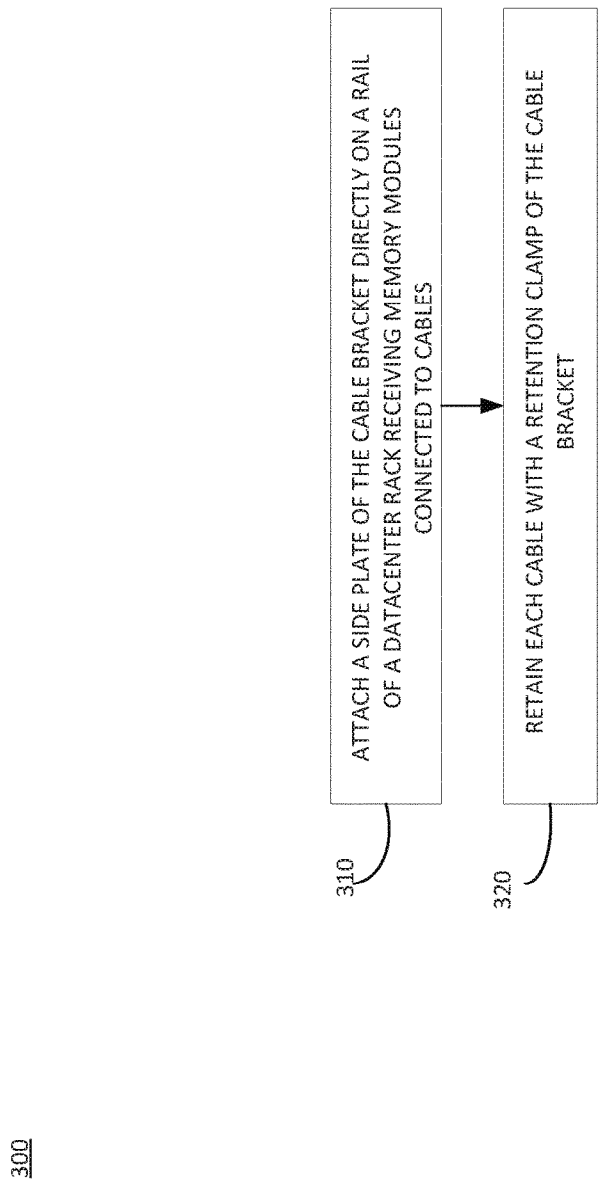
FIG. 3 illustrates an example of a flowchart for installing a cable bracket in a datacenter rack.

FIG. 3 shows a flux diagram 300 that comprises step 310 for attaching a side plate of the cable bracket directly on at least one rail of the datacenter rack, the datacenter rack receiving rack installed devices hold by two rails, the device being connected to a plurality of cables. The cable bracket can comprise a plurality of consecutive retention clamps and the side plate can be longitudinally connected to the plurality of retention clamps. Attaching the side plate directly on at least one rail of the datacenter rack comprises attaching the side plate by means of mechanical attachment features on the rail of the rack. The rail can be the front rail of the data center rack and/or the rear rail of the datacenter rack. The mechanical attachment features can be e.g. screw holes adapted to align with holes established on the rail so the side plate can be directly attached on the rail by means of screws. Once the side plate is directly attached on the rail of the datacenter rack, the cable bracket may be located between the rail and a side panel of the datacenter rack without interrupting the installation of the side panel or increasing the risk of cord damaging.

Furthermore, the flux diagram 300 comprises step 320 for retaining each cable from the plurality of cables with a retention clamp of the cable bracket. The plurality of retention clamps can established consecutively along the cable bracket. In another example, two cables can be retained by each retention clamp if desired. A large number of retention clamps e.g. ten retention clamps can be incorporated into the cable bracket if desired.

The flux diagram 300 can further comprise a step for installing side panels on the datacenter rack. The cable bracket may not cause interruption during the installation of the side panels as the cable bracket may be located in a space between the rail of the datacenter rack and the side panel. After the installation of the side panel, the cable bracket according to the present disclosure can decrease the risk of cable cord damage and friction between the cord cables and the side panels.

Relative terms used to describe the structural features of the figures illustrated herein are in no way limiting to conceivable implementations. It is, of course, not possible to describe every conceivable combination of components or methods, but one of ordinary skill in the art will recognize that many further combinations and permutations are possible. Accordingly, the present disclosure is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements.

The invention claimed is:

1. A cable bracket for a datacenter rack, the cable bracket comprising:
   a plurality of retention clamps, each of the plurality of retention clamps to retain a cable; and
   a side plate longitudinally connected to the plurality of retention clamps, the side plate defining a plurality of holes,
      wherein the side plate of the cable bracket is to be directly attached by means of the plurality of holes using screws on a rail of the datacenter rack, and
      wherein the cable bracket is to be located between the rail and a side panel of the datacenter rack.

2. The cable bracket of claim 1, wherein the plurality of retention clamps are established consecutively on the cable bracket.

3. The cable bracket of claim 1, wherein the plurality of cables are data cables and/or power jumper cables connected to a plurality of rack installed devices.

4. The cable bracket of claim 1, wherein the rail is a rear rail of the datacenter rack.

5. The cable bracket of claim 1, wherein each of the plurality of retention clamps comprises a clamping slot that defines an opening.

6. A datacenter rack, the datacenter rack comprising:
   a rack, the rack comprising two side panels, a front rail and a rear rail;
   a plurality of devices included in the rack; and
   at least one cable bracket, the cable bracket comprising:
      a plurality of retention clamps, each of the plurality of retention clamps to retain a cable, and
      a side plate longitudinally connected to the plurality of retention clamps, the side plate defining a plurality of holes,
      wherein the side plate of the cable bracket is directly attached to the rear rail by means of the plurality of holes using screws and the cable bracket is located between the rear rail and one of the two side panels of the datacenter rack.

7. A method for installing a cable bracket in a datacenter rack, the method comprising:
   attaching a side plate of the cable bracket directly on a rail of the datacenter rack, the side plate defining a plurality of holes to attach the side plate by means of the plurality of holes using screws to the rail, the datacenter rack receiving devices held by two rails, the devices being connected to a plurality of cables;
   wherein the cable bracket comprises a plurality of retention clamps and the side plate is longitudinally connected to the plurality of retention clamps, and
   retaining the plurality of cables with the plurality of retention clamps of the cable bracket.

8. The method of claim 7, wherein attaching the side plate directly on a rail of the datacenter rack comprises locating the cable bracket between the rail and a side panel of the datacenter rack.

9. The method of claim 8, further comprising installing an additional side panel on the datacenter rack.

10. The method of claim 7, wherein the plurality of retention clamps are established consecutively along the cable bracket.

* * * * *